United States Patent [19]
Ståhl et al.

[11] Patent Number: 5,975,114
[45] Date of Patent: Nov. 2, 1999

[54] SYSTEM, METHOD AND APPARATUS FOR PURGING FLUID

[75] Inventors: Lennart Ståhl, Plano, Tex.; John Francis Wallace, Jr.; John Cardenas Parraz, both of San Ramon, Calif.; Montford Henry Clark, Basking Ridge, N.J.; David Winn, Lafayette, Calif.

[73] Assignee: Ericsson Inc., Research Triangle Park, N.C.

[21] Appl. No.: 09/088,755

[22] Filed: Jun. 2, 1998

[51] Int. Cl.[6] ........................................ E03B 1/00
[52] U.S. Cl. ..................... 137/312; 137/392; 137/487.5
[58] Field of Search ............................... 137/312, 487.5, 137/392

[56] References Cited

U.S. PATENT DOCUMENTS

| | | | |
|---|---|---|---|
| 4,836,237 | 6/1989 | McCullough | 137/312 |
| 5,190,069 | 3/1993 | Richards | 137/312 |
| 5,650,564 | 7/1997 | Wodeslavsky et al. | 137/312 |

OTHER PUBLICATIONS

Stahl and Zirath, *TELECOOL, a New Generation of Cooling Systems for Switching Equipment*, Ericsson Review, vol. 4, 1992, pp. 124–132.

*Primary Examiner*—David J. Walczak
*Attorney, Agent, or Firm*—Jenkens & Gilchrist, PC

[57] ABSTRACT

A system, method and apparatus for detecting a fluid leak in a fluid based cooling system and purging the fluid therein under various conditions. The system, method and apparatus detect fluid levels in the cooling system, fluid pressure in the cooling system and fluid spraying and dripping from the cooling system. Upon an affirmative determination of low fluid levels, low fluid pressure or fluid spraying and dripping from one or more locations in the cooling system, the device automatically purges the fluid from the cooling system. Accordingly, in an overhead fluid-based cooling system, any damage to objects below from having fluid leaked thereon is minimized.

30 Claims, 2 Drawing Sheets

SYSTEM, METHOD AND APPARATUS FOR PURGING FLUID

CROSS REFERENCE TO RELATED APPLICATION

This application is related to U.S. applications for patent, Ser. No. 09/089,333, filed Jun. 2, 1998, entitled "Spray Hood Protector in a Fluid-Based Cooling System" (Docket No. 27943-232); Ser. No. 09/088,958, filed Jun. 2, 1998, entitled "Cooling System And Method for Distributing Cooled Air" (Docket No. 27943-233); and Ser. No. 09/088,981, filed Jun. 2, 1998, entitled "Cooling System and Method for Separating Air Flows in a Cooling System" (Docket No. 27943-234).

BACKGROUND OF THE INVENTION

1. Technical Field of the Invention

The present invention relates to cooling systems for cooling electronic equipment, and particularly to a purge feature for a fluid based cooling system.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with all electronic equipment, telecommunications or otherwise, is temperature control. As is readily apparent, if telecommunications switching equipment or other electronic components are not effectively cooled, the internal temperature of the electronic components substantially increase, thereby leading to significantly reduced system performance and, in some cases, total system failure.

Conventional approaches to cooling the aforementioned central control or other such apparatus/equipment include fluid based cooling systems in which air is directed in the proximity of heat exchanger units or cooling coils having cooled liquid flowing therethrough. The air is cooled as it passes the cooled coils. By directing the resulting cooled air towards the equipment to be cooled, the internal temperature of the equipment is reduced, thereby allowing the equipment to operate more efficiently and with reduced risk of system failure.

The abovementioned conventional cooling systems employ piping elements to route the cooling fluid between the system components, such as between the pump unit and the cooling coils. One common problem with these cooling systems is that occasionally a break occurs in the seal between the piping elements, in the seal between the piping elements and the system components, and in the piping elements themselves. A break may cause the cooling fluid to drip or to spray outwardly from the system at the point of the break. If the break is more substantial, the cooling fluid may both drip and spray from the point of the break.

Leakage of cooling fluid caused by a break in conventional cooling systems poses a number of serious concerns. First, the fluid leak may cause the cooling system to run less efficiently, thereby increasing operating costs and prematurely aging the cooling system. Second, the fluid leak may result in an insufficient amount of cooling fluid being delivered to the cooling coils, thereby increasing the operating temperature of the electronic equipment. As stated above, an increase in operating temperature of the electronic equipment of a system may lead to a reduction in system performance and even total system failure.

Third, because portions of conventional cooling systems, such as the cooling coils and the piping elements connected thereto, are located in close proximity to electronic equipment which the cooling systems are adapted to cool, a break in the cooling system may result in cooling fluid leaking onto the equipment. Especially in the case wherein portions of the cooling system are suspended above the equipment, a spray leak or a drip leak of any magnitude may seriously damage the equipment and pose a threat of electrocution to a nearby operator. Needless to say, the potential harm resulting from a fluid leak in a fluid based cooling system is quite sizeable and reaches far beyond concerns for the cooling system itself.

It is an object of the present invention to provide a feature for a fluid based cooling system which quickly and accurately detects fluid leakage.

Another object of the present invention is to provide such a system which substantially minimizes fluid leakage from the cooling system upon a detection thereof.

It is another object of the present invention to provide a fluid leakage feature which is simple in construction, inexpensive to manufacture and easily retrofitted into existing fluid based cooling systems.

SUMMARY OF THE INVENTION

The present invention overcomes the shortcomings of prior cooling systems and satisfies a significant need for a cooling system which substantially eliminates the potential for damage due to fluid leakage therefrom. The present invention essentially immediately purges the cooling fluid from the cooling system upon a detection of fluid leakage.

According to the present invention, there is provided a device which is adapted for use in a fluid based cooling system employing one or more heat exchanger units and a means for passing cooling fluid therethrough. The device detects a fluid leak in the cooling system, and in the event of an affirmative detection of fluid leakage, substantially immediately purges the cooling fluid from the cooling system. Upon completion of the purging action, the cooling system has little if any remaining fluid that is capable of leaking from the system. Consequently, damage to nearby equipment and harm to equipment operators are minimized.

BRIEF DESCRIPTION OF THE DRAWINGS

A more complete understanding of the system and method of the present invention may be had by reference to the following detailed description when taken in conjunction with the accompanying drawings wherein.

DETAILED DESCRIPTION OF THE PREFERRED EMBODIMENTS

The present invention will now be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
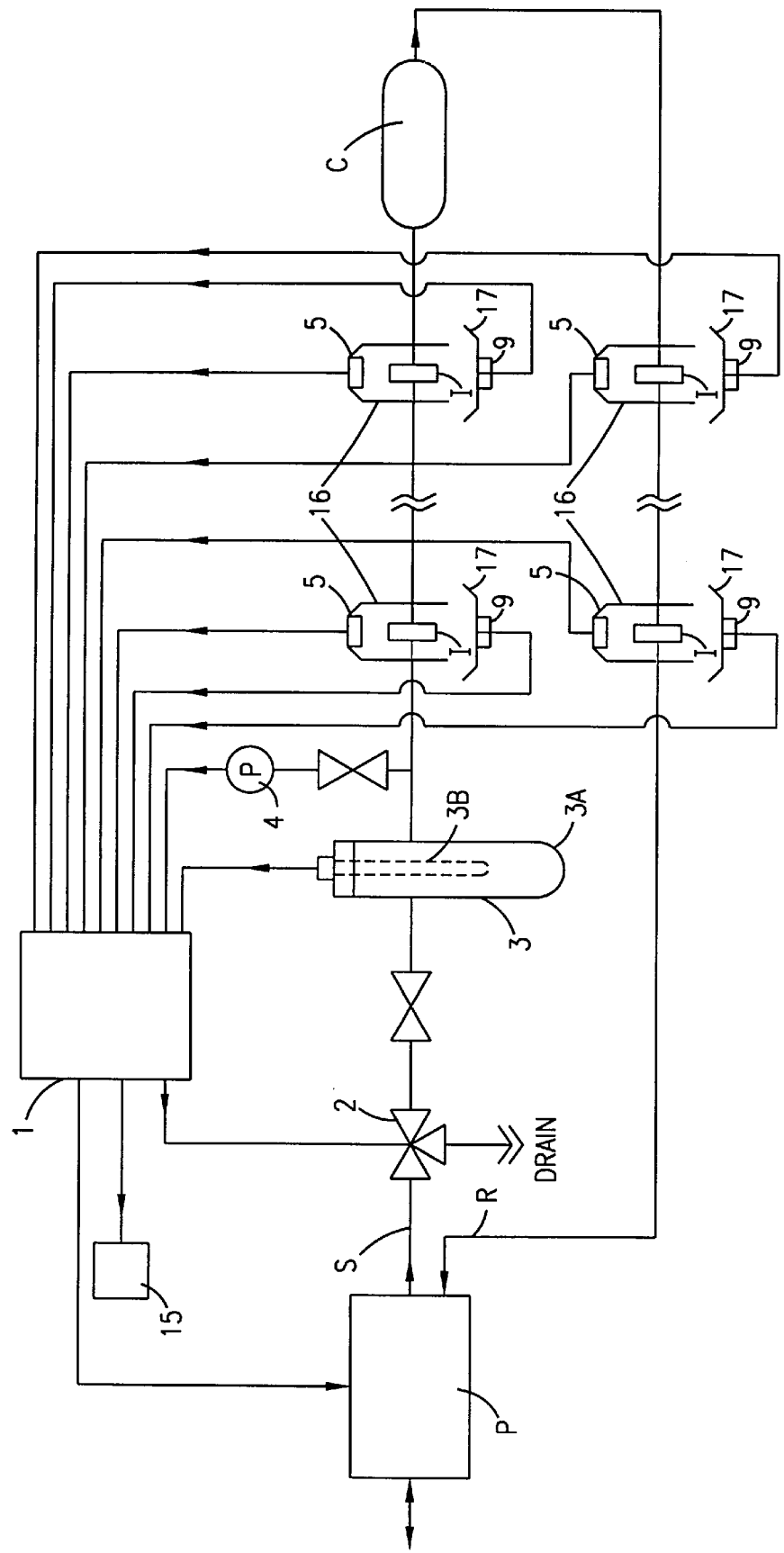
FIG. 1 is a diagram illustrating a preferred embodiment of the present invention.

Referring to FIG. 1, there is shown a coolant purge device for a fluid based cooling system. The present invention is adapted for positioning within the cooling system between the system's cooling heat exchanger unit and/or cooling coils C and the system's cooling and pump unit P. Cooling/ pump unit P pumps cooled fluid into supply line S. The cooled fluid passes through cooling coils C and returns to cooling/pump unit P via return line R. Although the present invention is shown as being connected to supply line S, it is understood that the present invention may be alternatively connected to return line R.

The present invention employs controller unit 1, purge valve 2, level sensor 3, pressure sensor 4, spray sensors 5 and drip sensors 9. In general terms, controller unit 1 preferably monitors the status of each sensor and initiates a purge operation in response to an affirmative determination that a fluid leak exists in the cooling system's fluid lines.

As shown in FIG. 1, level sensor 3 comprises shell 3A in which fluid accumulates from supply line S. Fluid level in shell 3A fluctuates with changes in fluid level in the cooling system. Level sensor 3 further includes sensing member 3B which is disposed within shell 3A and generates an electrical signal that is based on fluid level in shell 3A, and as such is indicative of fluid level in the cooling system. Controller unit 1 substantially continuously monitors the electrical signal generated by level sensor 3 in order to determine if the fluid level falls below a predetermined level.

The present invention further includes pressure sensor 4 which is connected to supply line S and measures the pressure of the fluid in the cooling system. Pressure sensor 4 generates an electrical signal that is indicative of the measured fluid pressure. The electrical signal generated by pressure sensor 4 is received by controller unit 1 for processing along the signal line shown in the figure.

Because a cooling system's cooling and pump unit P may be remotely located from cooling coils C, supply line S and return line R may extend substantial distances. Accordingly, supply line S and return line R may comprise a number of interconnected piping or hosing elements. The present invention is adapted to monitor the state of the seal between the various connected piping elements.

In this regard, the present invention preferably includes a plurality of spray hood assemblies 16, each of which is adapted to surround a major portion of a piping element interconnection I. Spray hoods 16 are preferably positioned a relatively short distance, from the piping element interconnection in order to contain fluid sprays therefrom.

In addition, the present invention preferably further comprises one or more spray sensors 5, each of which is adapted for securement to an inner surface of a respective one of the aforementioned spray hood assemblies 16. Spray sensors 5 detect impact by objects, including fluid. In this way, fluid sprayed from a leak at a connection between two piping elements can be sensed by the spray sensors 5 based upon the sprayed fluid impacting one or more respective sensors 5. Spray sensors 5 generate an electrical signal which is transmitted to controller unit 1 for processing along respective signal lines indicated in the figure.

Although a spray hood assembly 16 may be associated with a single spray sensor 5, as illustrated in FIG. 1, it is understood that a spray hood assembly 16 may include a plurality of spray sensors 5 therein to improve detection of fluid sprays.

In order to further monitor the status of piping interconnections in the cooling system, the present invention preferably includes a drip sensor for sensing fluid dripping from the aforedescribed interconnections I. The fluid drip sensor preferably includes at least one drip pan 17 disposed beneath each piping interconnection I, and at least one drip pan sensor 9 operatively associated with each drip pan 17. It should be understood that the respective drip pans 17 are preferably sized to receive an appreciable amount of fluid which may leak from a given piping interconnection I. Sensor 9 senses an accumulation of fluid within drip pan 17, generates an electrical signal that is indicative of a fluid leak status and transmits the signal to controller unit 1 for processing along the appropriate signal lines shown in the figure.

The present invention monitors the status of the cooling system, determines if a fluid leak exists, and takes immediate remedial measures in response to an affirmative determination that a fluid leak exists. In particular, controller unit 1 receives the electrical signals generated by level sensor 3, pressure sensor 4, spray sensors 5 and drip sensors 9 and determines the presence of a fluid leak in the cooling system based upon various combinations of these signals. In one embodiment of the present invention, controller unit 1 includes interface circuitry to receive the sensor-generated signals, and logic circuitry not only to perform a leakage determination but also to initiate and control the appropriate response thereto.

Figure 2:
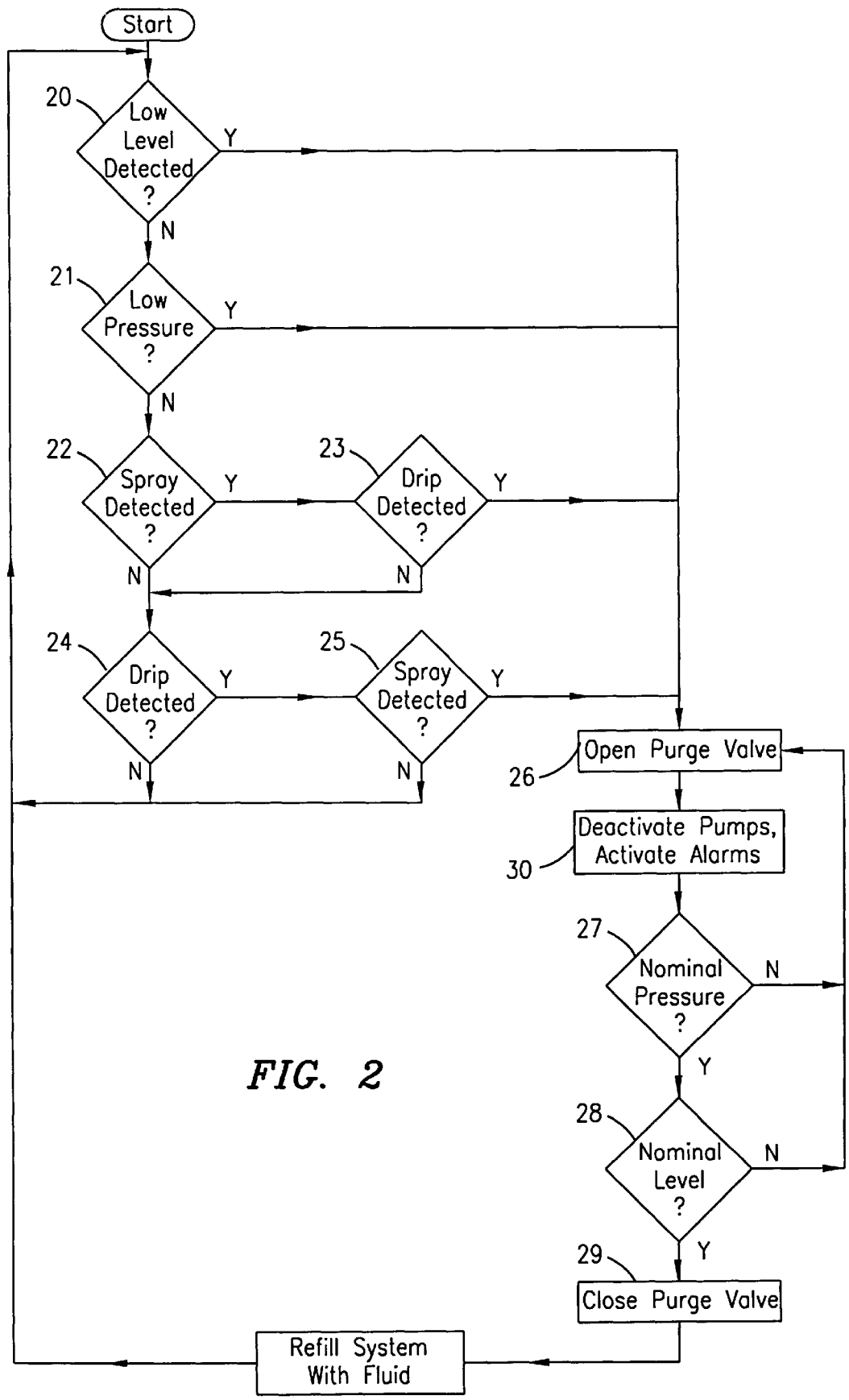
FIG. 2 is a flow chart illustrating the operation of a preferred embodiment of the present invention.

The function of controller unit 1 may be best described by illustrating the operation of the present invention in its entirety in conjunction with a conventional, fluid-based cooling system. Referring now to FIG. 2, there is shown a flow chart describing various operational steps of the present invention. It is, of course, understood that the present invention should not be limited to the specific order of operational steps illustrated in FIG. 2, and that the particular system operation shown in FIG. 2 is described herein for exemplary purposes only.

Controller unit 1 substantially continuously monitors the electrical signals generated by the abovementioned sensing elements and compares the signals to predetermined values. At step 20, controller unit 1 compares the signal generated by level sensor 3 with a predetermined fluid level value to determine whether the fluid level in the cooling system is at an acceptable level or below acceptable levels, thereby indicating potential fluid leakage. If the comparison indicates that the fluid level in the cooling system is at an acceptable level, controller unit 1 then compares the signal generated by pressure sensor 4 with a predetermined pressure value to determine whether fluid pressure in the cooling system is at an acceptable level or below acceptable levels, thereby indicating potential fluid leakage. As shown at step 21, if the comparison suggests that the fluid pressure in the cooling system is at an acceptable level, controller unit 1 then proceeds to step 22.

As shown in FIG. 2, if controller unit 1 determines that the cooling system is operating at unacceptably low fluid levels (step 20) or at an unacceptably low pressure level (step 21), the present invention then proceeds to step 26 with controller unit 1 initiating a fluid purge function, described in more detail hereinafter.

At step 22, controller unit 1 compares each of the signals generated by the spray sensors 5 with a predetermined spray value to determine if a spray leak exists at a given piping interconnection I in the cooling system. If the comparisons indicate that no fluid is currently being sprayed from the cooling system, controller unit 1 then proceeds to step 24. At step 24, the controller unit 1 compares each of the signals generated by the fluid drip sensors 9 with a predetermined fluid accumulation value to determine if an appreciable amount of fluid has dripped from a piping interconnection and accumulated within a drip tray 17. If the comparisons indicate that an appreciable amount of fluid has not been collected by any drip tray 17, controller unit 1 returns to step 20 and performs the fluid level, fluid pressure, fluid spray and fluid drip determinations over again.

In determining whether fluid leakage exists in the cooling system, it is prudent for a system to have the ability to distinguish the presence of a fluid leak from a false reading of a leak. A false reading may occur if, for example, fluid accumulates on spray sensor 5 or drip sensor 9 due to condensation build-up along supply line S or return line R. In an effort to correctly and accurately differentiate a fluid leak from a false reading, controller unit 1 will determine that a fluid leak exists at one or more piping interconnections I only if a fluid spray detection and a fluid drip detection concurrently exist within the system, usually at the same piping interconnection I. This is illustrated in FIG. 2, where if a fluid spray is detected, e.g., at a first piping interconnection I at step 22, controller unit 1 then determines at step 23 whether a fluid drip occurs at that same or any other piping interconnection I. Upon an affirmative determination that fluid is being sprayed as fluid is dripping, controller unit 1 initiates the fluid purge operation.

Similarly, if a fluid drip is detected at a particular piping interconnection I at step 24, controller unit 1 then determines at step 25 whether a fluid spray occurs at that same or any other piping interconnection I. Upon an affirmative determination that fluid is being sprayed as fluid is dripping, controller unit 1 initiates the fluid purge operation, as described before. It should be understood that although the clear leakage scenario is when the spray and drip occur along the same piping interconnection I, the system, method and apparatus of the present invention are designed to detect situations where sprays cause drips in other piping interconnections I or other scenarios.

At step 26 of the operational chart of FIG. 2, the present invention initiates a fluid purge function by controller unit 1 opening purge valve 2 (FIG. 1). Purge valve 2 preferably includes a three-way valve which selectively opens two valve ports to a third valve port. In this case, purge valve 2 is configured in the cooling system such that the two valve ports are connected along supply line S and the third valve port is in fluid connection with a drain or other depository. Once opened, purge valve 2 discharges substantially the entire amount of fluid in the cooling system into the drain.

Soon after purge valve 2 is opened, controller unit 1 at step 30 activates one or more alarms 15 to alert a system operator of the presence of a fluid leak and the initiation of a fluid purge function. In addition, controller unit 1 deactivates the pump in cooling and pump unit P which supplies the fluid to cooling coils C.

After initially opening purge valve 2, controller unit 1 maintains purge valve 2 in an open state for a sufficient period of time to ensure that most all of the fluid in the cooling system has been discharged therefrom. In one embodiment of the present invention, controller unit 1 monitors the signals generated by the level sensor 3 (step 28) and pressure sensor 4 (step 27) during the purge operation. When controller unit 1 determines that a near zero fluid pressure level and a negligible amount of fluid exists in the cooling system, controller unit 1 may automatically close purge valve 2 and wait for permission to refill the cooling system with fluid and begin the monitoring activity again.

In an alternate preferred embodiment, however, instead of monitoring the status of the fluid level and fluid pressure in the cooling system following initiation of the fluid purge function, controller unit 1 may maintain purge valve 2 in the open state for a predetermined period of time for sufficiently draining the cooling system. Refilling is done manually to best control and monitor system performance.

Although the preferred embodiments of the system and method of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. In an overhead, fluid-based cooling system, a purge system attached to said cooling system for purging fluid therein, said purge system comprising:

leakage detection means for detecting fluid leakage from said cooling system; and purge means for purging said fluid from the cooling system in response to an affirmative detection of fluid leakage by said leakage detection means.

2. The purge system according to claim 1, wherein said leakage detection means comprises a fluid level detector in the cooling system.

3. The purge system according to claim 1, wherein said leakage detection means comprises a fluid pressure detector in the cooling system.

4. The purge system according to claim 1, wherein said leakage detection means comprises a fluid spray detector for detecting fluid spraying from a break in the cooling system.

5. The purge system according to claim 4, wherein said fluid spray detector comprises a hood assembly substantially surrounding a portion of the cooling system, and an impact detector for sensing fluid impacting an inner surface of said hood assembly.

6. The purge system according to claim 4, wherein said leakage detection means further comprises a fluid drip detector for detecting fluid dripping from another break in the cooling system.

7. The purge system according to claim 6, wherein said break and said another break in the cooling system are the same.

8. The purge system according to claim 6, wherein said purge means purges fluid from the cooling system in response to an affirmative, concurrent detection of dripping fluid detected by said fluid drip detector and spraying fluid detected by said fluid spray detector.

9. The purge system according to claim 6, wherein said leakage detection means includes a means for distinguishing between fluid leakage in the cooling system and condensation build-up therein.

10. The purge system according to claim 1, wherein said leakage detection means comprises a fluid drip detector for detecting fluid dripping from a break in the cooling system.

11. The purge system according to claim 10, wherein said fluid drip detector comprises a pan member disposed beneath a portion of the cooling system, and a fluid detector for detecting an accumulation of fluid on said pan member.

12. The purge system according to claim 1, wherein said leakage detection means includes a means for sensing a change in a fluid condition in the cooling system, and a control means for monitoring said fluid condition sensing means and for activating said purge means based upon said monitoring.

13. The purge system according to claim 1, wherein said purge means comprises a valve assembly in fluid communication with the cooling system, whereby opening of said valve assembly in response to said leakage detection means discharges said fluid from the cooling system.

14. In an overhead, fluid-based cooling system, a method for controlling purging of fluid therein, said method comprising the steps of:

sensing a fluid condition within said cooling system;

determining the; existence of a fluid leak in the system based upon said sensing step; and purging the cooling system of fluid in response to an affirmative determination in said determining step of fluid leakage from the cooling system.

15. The method according to claim 14, wherein said sensing step comprises the step of sensing a fluid level within the cooling system.

16. The method according to claim 14, wherein said sensing step comprises the step of sensing fluid pressure within the cooling system.

17. The method according to claim 14, wherein said sensing step comprises the step of detecting fluid spraying from the cooling system.

18. The method according to claim 14, wherein said sensing step comprises the step of detecting fluid dripping from the cooling system.

19. The method according to claim 14, wherein said determining step comprises the step of determining if fluid is concurrently dripping and spraying from the cooling system.

20. The method according to claim 14, wherein:

said cooling system includes a purge valve; and said purging step comprises the step of opening said purge valve.

21. The method according to claim 14, wherein said determining step includes the step of differentiating between fluid leakage in the cooling system and condensation build-up in the cooling system.

22. In an overhead fluid-based cooling system, a control apparatus therein for controlling the purging of fluid within said cooling system, said control apparatus comprising:

a means for detecting a fluid condition in the cooling system; and a means for automatically purging the fluid from the cooling system based upon a detection of said fluid condition by said fluid condition detecting means.

23. The apparatus of claim 22, wherein said fluid condition detecting means comprises a means for detecting a fluid leak in the cooling system.

24. The apparatus of claim 22, wherein said fluid condition detecting means comprises a means for sensing fluid in the cooling system, and a means for comparing said sensed fluid with a predetermined value.

25. The apparatus of claim 24, wherein said sensing means comprises a means for sensing a fluid level in the cooling system.

26. The apparatus of claim 24, wherein said sensing means comprises a means for sensing fluid pressure in the cooling system.

27. The apparatus of claim 24, wherein said sensing means comprises a means for sensing fluid spraying from the cooling system.

28. The apparatus of claim 24, wherein said sensing means comprises a means for sensing fluid dripping from the cooling system.

29. The apparatus of claim 22, wherein said fluid condition detecting means includes a means for determining if fluid is concurrently dripping from and spraying from the cooling system.

30. The apparatus of claim 22, wherein:

said fluid condition detecting means comprises a means for detecting a plurality of fluid conditions in the cooling system; and said purging means is response to a detection of any of said fluid conditions in the cooling system.

* * * * *

UNITED STATES PATENT AND TRADEMARK OFFICE
CERTIFICATE OF CORRECTION

PATENT NO. : 5,975,114
DATED : November 2, 1999
INVENTOR(S) : Lennart Stahl et al.

Page 1 of 1

It is certified that error appears in the above-identified patent and that said Letters Patent is hereby corrected as shown below:

<u>Title page,</u>
Item [75] Inventors: replace "John Francis Wallace, Jr.; John Cardenas Parraz, both of San Ramon, Calif." with -- John Francis Wallace, Jr., San Ramon, Calif.; John Cardenas Parraz, Gig Harbor, Washington; --

Signed and Sealed this

Second Day of April, 2002

*Attest:*

JAMES E. ROGAN
*Attesting Officer*   *Director of the United States Patent and Trademark Office*